(12) United States Patent
Hamamoto et al.

(10) Patent No.: US 11,281,090 B2
(45) Date of Patent: Mar. 22, 2022

(54) SUBSTRATE WITH A MULTILAYER REFLECTIVE FILM, REFLECTIVE MASK BLANK, REFLECTIVE MASK, AND METHOD OF MANUFACTURING SEMICONDUCTOR DEVICE

(71) Applicant: HOYA CORPORATION, Tokyo (JP)

(72) Inventors: Kazuhiro Hamamoto, Tokyo (JP); Tsutomu Shoki, Tokyo (JP); Yohei Ikebe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 116 days.

(21) Appl. No.: 16/754,306

(22) PCT Filed: Oct. 16, 2018

(86) PCT No.: PCT/JP2018/038499
§ 371 (c)(1),
(2) Date: Apr. 7, 2020

(87) PCT Pub. No.: WO2019/078205
PCT Pub. Date: Apr. 25, 2019

(65) Prior Publication Data
US 2020/0310239 A1    Oct. 1, 2020

(30) Foreign Application Priority Data
Oct. 17, 2017  (JP) .............................. JP2017-201188

(51) Int. Cl.
*G03F 1/24* (2012.01)
*G03F 1/42* (2012.01)

(52) U.S. Cl.
CPC . *G03F 1/24* (2013.01); *G03F 1/42* (2013.01)

(58) Field of Classification Search
USPC .......................................................... 430/5
See application file for complete search history.

(56) References Cited

U.S. PATENT DOCUMENTS

| 2010/0237256 A1 | 9/2010 | Yoshitake |
| 2014/0186753 A1 | 7/2014 | Okamura et al. |
| 2017/0082916 A1 | 3/2017 | Hanekawa et al. |
| 2019/0079382 A1 | 3/2019 | Shoki et al. |

FOREIGN PATENT DOCUMENTS

| JP | 2010-219445 A | 9/2010 |
| JP | 2017-058666 A | 3/2017 |
| JP | 2017-075997 A | 4/2017 |
| WO | 2013/031863 A1 | 3/2013 |
| WO | 2017/169973 A1 | 10/2017 |

OTHER PUBLICATIONS

PCT/JP2018/038499, "English Translation of International Search Report", dated Dec. 11, 2018, 1 page.
SG11202002424R, "Invitation to Respond to Written Opinion", dated Jul. 20, 2021, 7 pages.
JP2019-549294, "Notice of Reasons for Refusal" with Machine Translation, dated Feb. 8, 2022, 5 pages.

*Primary Examiner* — Christopher G Young
(74) *Attorney, Agent, or Firm* — Kilpatrick Townsend & Stockton LLP

(57) ABSTRACT

A substrate with a multilayer reflective film, a reflective mask blank, a reflective mask and a method of manufacturing a semiconductor device can prevent contamination of the surface of the multilayer reflective film even in the case of having formed reference marks on the multilayer reflective film. A substrate with a multilayer reflective film contains a substrate, a multilayer reflective film that reflects EUV light formed on the substrate, and a protective film formed on the multilayer reflective film. Reference marks are formed to a concave shape on the surface of the protective film. A surface layer of the reference marks contains an element that is the same as at least one of the elements contained in the protective film. A shrink region, where at least a portion of the plurality of films contained in the multilayer reflective film are shrunk, is formed at the bottom of the reference marks.

19 Claims, 5 Drawing Sheets

SUBSTRATE WITH A MULTILAYER REFLECTIVE FILM, REFLECTIVE MASK BLANK, REFLECTIVE MASK, AND METHOD OF MANUFACTURING SEMICONDUCTOR DEVICE

CROSS-REFERENCE TO RELATED APPLICATIONS

This application is a National Stage of International Application No. PCT/JP2018/038499, filed Oct. 16, 2018, which claims priority to Japanese Patent Application No. 2017-201188, filed Oct. 17, 2017, and the contents of which is incorporated by reference.

TECHNICAL FIELD

The present disclosure relates to a substrate with a multilayer reflective film, a reflective mask blank, a reflective mask and a method of manufacturing a semiconductor device.

BACKGROUND ART

Accompanying the growing demand for higher levels of density and precision of very large scale integrated (VLSI) devices in recent years, EUV lithography, which is an exposure technology that uses extreme ultraviolet (EUV) light, is considered to be promising. Here, EUV light refers to light in the wavelength band of the soft X-ray region or vacuum ultraviolet region, and specifically, light having a wavelength of about 0.2 nm to 100 nm. Reflective masks have been proposed as masks for use in this EUV lithography. Such reflective masks have a multilayer reflective film that reflects exposure light formed on a substrate of glass or silicon, and have an absorber film pattern that absorbs exposure light formed on the multilayer reflective film. Light that has entered a reflective mask equipped in an exposure apparatus that carries out pattern transfer is absorbed at the portion where the absorber film pattern is present, and is reflected by a multilayer reflective film at the portion where the absorber film pattern is not present. The reflected light is transferred onto a semiconductor substrate such as a semiconductor wafer through a reflective optical system.

Problems in the lithography process are becoming quite prominent due to the growing demand for miniaturization of the lithography process. One of those problems relates to defect information regarding mask blank substrates that is used in the lithography process.

In conventional mask blank inspections, the location of the presence of a substrate defect was specified by designating the center of the substrate as the origin (0,0) and specifying the distance from the origin by using coordinates managed by a defect inspection apparatus. Consequently, the reference for absolute value coordinates was unclear, positional accuracy was low, and there were variations in detection between apparatuses. In addition, even in the case of patterning a thin film for pattern formation by avoiding defects during pattern drawing, it was difficult to avoid defects on the μm order. Consequently, defects were avoided by changing the direction of pattern transfer or roughly shifting the transfer location on the mm order.

Under such circumstances, it was proposed, for example, to form reference marks on a mask blank substrate and specify the location of a defect based on those reference marks. As a result of forming reference marks on the mask blank substrate, shifts in the reference for specifying the location of a defect for each apparatus are prevented.

It is particularly important to accurately specify the location of a defect on a multilayer reflective film in reflective masks using EUV light as exposure light. This is because defects present on a multilayer reflective film are not only nearly impossible to correct, but also can become serious phase defects on a transferred pattern.

In order to accurately specify the location of a defect on a multilayer reflective film, it is preferable to acquire defect location information by carrying out a defect inspection after having formed the multilayer reflective film. In order to do this, reference marks are preferably formed on the multilayer reflective film formed on the substrate.

Patent Literature 1 discloses reference marks formed to a concave shape by removing a portion of a multilayer reflective film. Laser ablation and a focused ion beam (FIB) are disclosed as methods for removing a portion of the multilayer reflective film.

PRIOR ART LITERATURE

Patent Literature

Patent Literature 1: International Publication No. WO 2013/031863

DISCLOSURE OF THE INVENTION

Problems to be Solved by the Disclosure

However, in the case of having formed concave reference marks on the surface of a multilayer reflective film by laser ablation, the surface of the multilayer reflective film may be contaminated by dust generated during laser processing. In the case the surface of the multilayer reflective film has been contaminated, new foreign matter defects may occur. In the case foreign matter defects have occurred, serious problems may occur when producing a reflective mask if those defects become exposure defects.

The multilayer reflective film is occasionally etched in the direction of depth in order to form concave reference marks in the multilayer reflective film. In the case of having etched the multilayer reflective film in the direction of depth, the material of the multilayer reflective film, such as a Mo/Si film, may be exposed on the concave side formed by etching. A Mo film may be exposed on the surface at the bottom of concave portion formed by etching. In addition, etching reactants may adhere to the sides and bottom. Cleaning resistance of the substrate becomes poor in the case a material contained in the multilayer reflective film has been exposed. A substrate cleaning step is included in the fabrication process of a reflective mask blank or reflective mask. In the case cleaning resistance of the substrate has become poor, material on the sides and/or bottom of the reference marks is eluted during the substrate cleaning process, the shape of the marks fluctuates, positional accuracy worsens due to increased edge roughness, and problems such as separation of film from the etched surface occur. In addition, attached material may be detached by the cleaning process resulting in the risk of contamination due those materials being reattached.

In the case of forming concave reference marks on the surface of a reflective mask blank with a FIB, the amount of time required for processing becomes long due to the slow processing speed of the FIB method. Consequently, it is difficult to produce reference marks of a required length (such as 550 μm).

Therefore, an object of the present disclosure is to provide a substrate with a multilayer reflective film, reflective mask blank, reflective mask and method of manufacturing a semiconductor device, which are able to prevent contamination of the surface of a multilayer reflective film even in the case of having formed reference marks on the multilayer reflective film. In addition, an object of the present disclosure is to provide a substrate with a multilayer reflective film, reflective mask blank, reflective mask and method of manufacturing a semiconductor device, which are able to prevent deterioration of cleaning resistance of a substrate. Moreover, an object of the present disclosure is to provide a substrate with a multilayer reflective film, reflective mask blank, reflective mask and method of manufacturing a semiconductor device, which are able to shorten the amount of time required to process reference marks.

Means for Solving the Problems

The present disclosure has the following configurations to solve the aforementioned problems.

(Configuration 1)

A substrate with a multilayer reflective film comprising a substrate, a multilayer reflective film that reflects EUV light formed on the substrate, and a protective film formed on the multilayer reflective film; wherein, reference marks formed to a concave shape are provided on the surface of the protective film, and a surface layer of the reference marks contains an element that is the same as at least one of the elements contained in the protective film, and a bottom of the reference marks has a shrink region where at least a portion of the plurality of films contained in the multilayer reflective film is shrunk.

(Configuration 2)

The substrate with the multilayer reflective film described in Configuration 1, wherein the surface layer of the reference marks contains Ru.

(Configuration 3)

The substrate with the multilayer reflective film described in Configuration 2, wherein the surface layer of the reference marks contains at least one selected from the group consisting of RuO, RuNbO, RuSi and RuSiO.

(Configuration 4)

The substrate with the multilayer reflective film descried in any of Configurations 1 to 3, having a mixing region, where at least a portion of a plurality of the films contained in the multilayer reflective film are mutually integrated, at the bottom of the reference marks.

(Configuration 5)

The substrate with the multilayer reflective film described in any of Configurations 1 to 4, wherein the depth of the reference marks is 30 nm to 50 nm.

(Configuration 6)

The substrate with the multilayer reflective film described in any of Configurations 1 to 5, wherein the surface layer of the multilayer reflective film on the opposite side from the substrate is a layer that contains Si.

(Configuration 7)

A reflective mask blank having the substrate with the multilayer reflective film described in any of Configurations 1 to 6 and an absorber film that absorbs EUV light formed on the protective film of the substrate with the multilayer reflective film; wherein, the shape of the reference marks is transferred to the absorber film.

(Configuration 8)

A reflective mask having the substrate with the multilayer reflective film described in any of Configurations 1 to 6 and an absorber film pattern that absorbs EUV light formed on the protective film of the substrate with the multilayer reflective film; wherein, the shape of the reference marks is transferred to the absorber film pattern.

(Configuration 9)

A method of manufacturing a semiconductor device having a step for forming a transfer pattern on a semiconductor substrate using the reflective mask described in Configuration 8.

Effects of the Disclosure

According to the present disclosure, a substrate with a multilayer reflective film, a reflective mask blank, a reflective mask and a method of manufacturing a semiconductor device can be provided that are able to prevent contamination of the surface of the multilayer reflective film even in the case of having formed reference marks on the multilayer reflective film. In addition, a substrate with a multilayer reflective film, a reflective mask blank, a reflective mask and a method of manufacturing a semiconductor device can be provided that are able to prevent deterioration of cleaning resistance of the substrate. Moreover, a substrate with a multilayer reflective film, a reflective mask blank, a reflective mask and a method of manufacturing a semiconductor device can be provided that are able to shorten the amount of time required to process reference marks.

MODE FOR CARRYING OUT THE DISCLOSURE

The following provides a detailed explanation of embodiments of the present disclosure.

[Substrate with a Multilayer Reflective Film]

Figure 1:
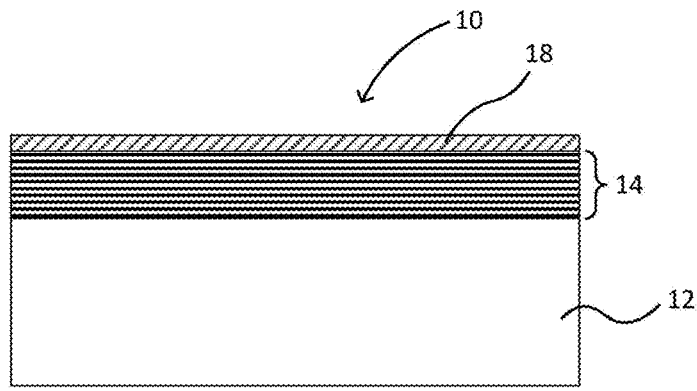
FIG. 1 is a schematic diagram showing a cross-section of a substrate with a multilayer reflective film.

FIG. 1 is a schematic diagram showing a cross-section of a substrate with a multilayer reflective film of the present embodiment.

As shown in FIG. 1, a substrate with a multilayer reflective film 10 is provided with a substrate 12, a multilayer reflective film 14 that reflects EUV light, which is exposure light, and a protective film 18 for protecting the multilayer reflective film 14. The multilayer reflective film 14 is formed on the substrate 12 and the protective film 18 is formed on the multilayer reflective film 14.

Furthermore, in the present description, the term "on" a substrate or film refers to not only to the case of contacting the upper surface of the substrate or film, but also includes the case of not contacting the upper surface of the substrate or film. Namely, "on" a substrate or film includes the case of a new film being formed over the substrate or film as well as the case of another film being interposed between the substrate or film. In addition, the term "on" does not necessarily refer to the upper side in the vertical direction, but merely indicates the relative positional relationship of the substrate or film.

<Substrate>

A substrate having a low coefficient of thermal expansion within the range of 0±5 ppb/° C. is preferably used for the substrate 12 used in the substrate with the multilayer reflective film 10 of the present embodiment to prevent distortion of the absorber film pattern caused by heat during exposure. Examples of materials having a low coefficient of thermal expansion within this range that can be used include $SiO_2$—$TiO_2$-based glass and multicomponent glass ceramics.

The main surface on the side of the substrate 12 where a transfer pattern (and the absorber film pattern to be subsequently described corresponds thereto) is formed is preferably processed to enhance the degree of flatness. Enhancing the degree of flatness of the main surface of the substrate 12 makes it possible to enhance positional accuracy and transfer accuracy of the pattern. For example, in the case of EUV exposure, the degree of flatness in a 132 mm×132 mm region of the main surface on the side of the substrate 12 where the transfer pattern is formed is preferably not more than 0.1 μm, more preferably not more than 0.05 μm and even more preferably not more than 0.03 μm. In addition, the main surface on the opposite side from the side where the transfer pattern is formed is the side immobilized in an exposure apparatus by electrostatic chucking, and the degree of flatness in a 142 mm×142 mm region thereof is preferably not more than 1 μm, more preferably not more than 0.5 μm and even more preferably not more than 0.03 μm. Furthermore, degree of flatness in the present description is a value that represents the warpage (amount of deformation) of a surface as indicated by Total Indicated Reading (TIR), and is the absolute value between the highest location of the substrate surface above the focal plane and the lowest location of the substrate surface below the focal plane when a plane determined according to the least squares method based on the substrate surface is defined as the focal plane.

In the case of EUV exposure, surface roughness of the main surface on the side of the substrate 12 where the transfer pattern is formed is preferably not more than 0.1 nm in terms of the root mean square (RMS) roughness. Furthermore, surface smoothness can be measured with an atomic force microscope.

The substrate 12 preferably has high rigidity in order to prevent deformation caused by film stress of a film (such as the multilayer reflective film 14) formed thereon. In particular, the substrate 12 preferably has a high Young's modulus of not less than 65 GPa.

<Multilayer Reflective Film>

The substrate with the multilayer reflective film 10 is provided with the substrate 12 and the multilayer reflective film 14 formed on the substrate 12. The multilayer reflective film 14 is comprised of, for example, a multilayer film obtained by cyclically laminating elements having different refractive indices. The multilayer reflective film 14 has the function of reflecting EUV light.

In general, the multilayer reflective film 14 is comprised of a multilayer film obtained by alternately laminating about 40 to 60 cycles of a thin film of a light element or compound thereof that is a high refractive index material (high refractive index layer), and a thin film of a heavy element or compound thereof that is a low refractive index material (low refractive index layer).

The high refractive index layer and low refractive index layer may be laminated for a plurality of cycles in this order starting from the side of the substrate 12 in order to form the multilayer reflective film 14. In this case, a single laminated structure consisting of the high refractive index layer/low refractive index layer constitutes one cycle.

The low refractive index layer and high refractive index layer may be laminated for a plurality of cycles in this order starting from the side of the substrate 12 in order to form the multilayer reflective film 14. In this case, a single laminated structure consisting of the low refractive index layer/high refractive index layer constitutes one cycle.

Furthermore, the uppermost layer of the multilayer reflective film 14, namely the surface layer of the multilayer reflective film 14 on the opposite side from the substrate 12, is preferably a high refractive index layer. In the case of laminating a high refractive index layer and low refractive index layer in this order starting from the side of the substrate 12, the uppermost layer is the low refractive index layer. However, in the case the low refractive index layer is the surface of the multilayer reflective film 14, a high refractive index layer is formed on the low refractive index layer since reflectance of the multilayer reflective film decreases due to the low refractive index layer being easily oxidized. On the other hand, in the case of laminating the low refractive index layer and high refractive index layer in this order starting from the side of the substrate 12, the uppermost layer is the high refractive index layer. In this case, the uppermost high refractive index layer becomes the surface of the multilayer reflective film 14.

In the present embodiment, the high refractive index layer may be a layer containing Si. The high refractive index layer may contain Si only or a Si compound. The Si compound may contain Si and at least one element selected from the group consisting of B, C, N and O. Use of a layer containing Si as a high refractive index layer allows the obtaining of a multilayer reflective film having superior reflectance of EUV light.

In the present embodiment, at least one element selected from the group consisting of Mo, Ru, Rh and Pt or an alloy containing at least one element selected from the group consisting of Mo, Ru, Rh and Pt can be used as a low refractive index material.

For example, a Mo/Si multilayer reflective film, obtained by alternately laminating about 40 to 60 cycles of a Mo film and Si film, can preferably be used for the multilayer reflective film 14 for EUV light having a wavelength of 13 nm to 14 nm. In addition, a Ru/Si cyclically laminated film, Mo/Be cyclically laminated film, Mo compound/Si compound cyclically laminated film, Si/Nb cyclically laminated film, Si/Mo/Ru cyclically laminated film, Si/Mo/Ru/Mo cyclically laminated film or Si/Ru/Mo/Ru cyclically laminated film, for example, can be used as a multilayer reflective film used in the region of EUV light. The material of the multilayer reflective film can be selected in consideration of exposure wavelength.

Reflectance of this multilayer reflective film 14 alone is, for example, not less than 65%. The upper limit of reflectance of the multilayer reflective film 14 is, for example, 73%. Furthermore, the thickness and cycle of the layers contained in the multilayer reflective film 14 can be selected so as to satisfy Bragg's law.

The multilayer reflective film 14 can be formed according to a known method. The multilayer reflective film 14 can be formed by, for example, ion beam sputtering.

For example, in the case the multilayer reflective film 14 is a Mo/Si multilayer film, a Mo film having a thickness of about 3 nm is formed on the substrate 12 using a Mo target by ion beam sputtering. Next, a Si film having a thickness of about 4 nm is formed using a Si target. The multilayer reflective film 14 obtained by laminating 40 to 60 cycles of Mo/Si film can be formed by repeating this procedure. At this time, the uppermost layer of the multilayer reflective film 14 on the opposite side from the substrate 12 is a layer that contains Si (Si film). The thickness of one cycle of Mo/Si film is 7 nm.

<Protective Film>

The substrate with the multilayer reflective film 10 of the present embodiment is provided with the protective film 18 formed on the multilayer reflective film 14. The protective film 18 has the function of protecting the multilayer reflective film 14 when patterning an absorber film or during pattern correction. The protective film 18 is provided between the multilayer reflective film 14 and an absorber film to be subsequently described.

A material such as Ru, Ru—(Nb, Zr, Y, B, Ti, La, Mo, Co or Re) compound, Si—(Ru, Rh, Cr or B) compound, Si, Zr, Nb, La or B can be used for the material of the protective film 18. In addition, a compound obtained by adding nitrogen, oxygen or carbon thereto can be used. Among these, the application of a material containing ruthenium (Ru) make the reflectance properties of the multilayer reflective film more favorable. Specifically, the material of the protective film 18 is preferably Ru or a Ru—(Nb, Zr, Y, B, Ti, La, Mo, Co or Re) compound. The thickness of the protective film 18 is, for example, 1 nm to 5 nm. The protective film 18 can be formed according to a known method. The protective film 18 can be formed by, for example, magnetron sputtering or ion beam sputtering.

The substrate with the multilayer reflective film 10 may further have a back side conductive film on the main surface of the substrate 12 on the opposite side from the side where the multilayer reflective film 14 is formed. The back side conductive film is used when electrostatically adsorbing the substrate with the multilayer reflective film 10 or a reflective mask blank with an electrostatic chuck.

The substrate with the multilayer reflective film 10 may also have a base film formed between the substrate 12 and the multilayer reflective film 14. The base film is formed for the purpose of, for example, improving smoothness of the surface of the substrate 12. The base film is formed for the purpose of, for example, reducing defects, improving reflectance of the multilayer reflective film and correcting stress in the multilayer reflective film.

<Reference Marks>

Figure 2:
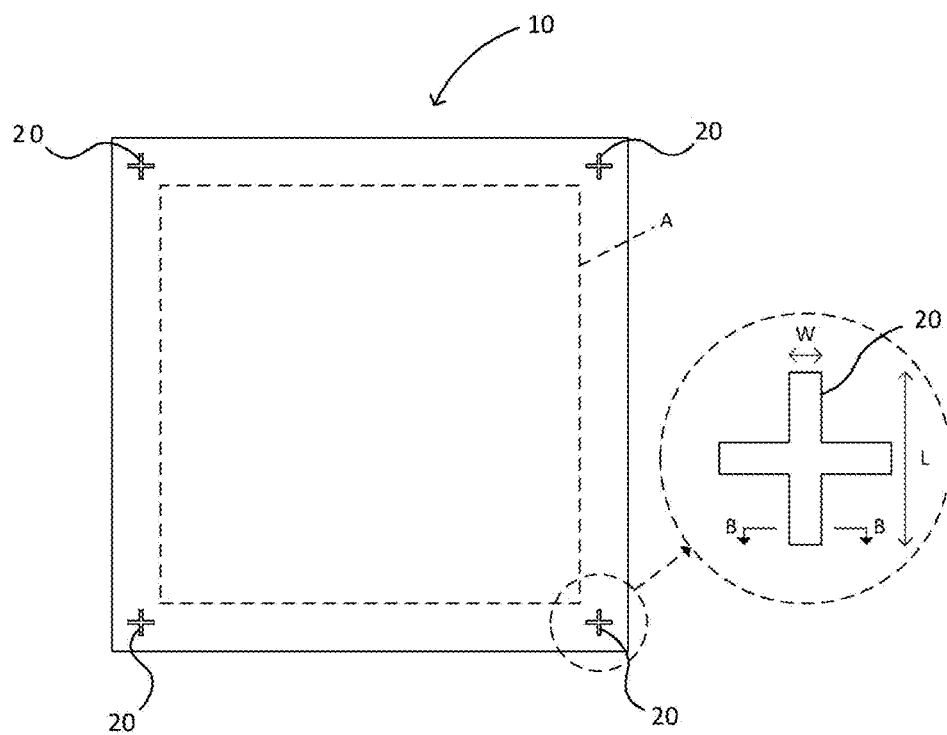
FIG. 2 is an overhead view of a substrate with a multilayer reflective film and an enlarged view of a reference mark.

FIG. 2 is an overhead view of the substrate with the multilayer reflective film 10 of the present embodiment.

As shown in FIG. 2, reference marks 20, which are used as references for defect locations in defect information, are respectively formed in the vicinity of the four corners of the roughly rectangular substrate with the multilayer reflective film 10. Furthermore, although the examples indicates the formation of 4 reference marks 20, the number of reference marks 20 is not limited to 4, but rather may be not more than 3 or not less than 5.

In the substrate with the multilayer reflective film 10 shown in FIG. 2, the region to the inside of the broken line A (132 mm×132 mm) is a pattern formation region where an absorber film pattern is formed when fabricating a reflective mask. The region outside the broken line A is a region where an absorber film pattern is not formed when fabricating a reflective mask. The reference marks 20 are preferably formed in the region where the absorber film pattern is not formed, namely in the region outside the broken line A.

As shown in FIG. 2, the reference marks 20 having a roughly cross-like shape. The width of one section W of the roughly cross-shaped reference marks 20 is, for example, 200 nm to 10 μm. The length of one section L of the reference marks 20 is, for example, 100 μm to 1500 μm. Although FIG. 2 indicates an example of the reference marks 20 having a roughly cross-like shape, the shape of the reference marks 20 is not limited thereto. The shape of the reference marks 20 may be, for example, roughly L-shaped when viewed from overhead.

Figure 3:
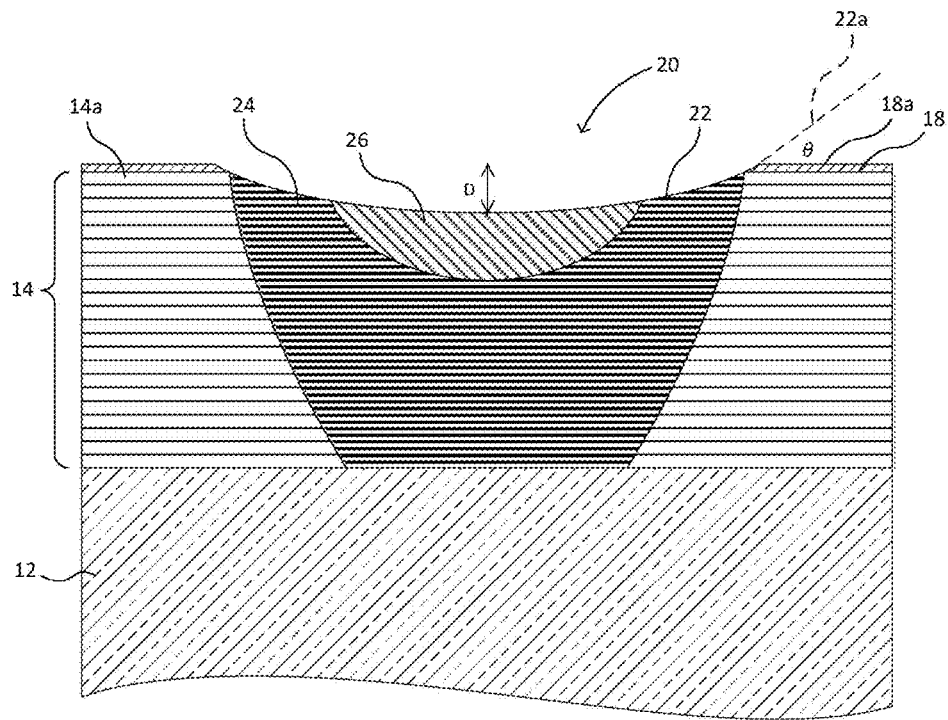
FIG. 3 is a cross-sectional view taken along line B-B of the reference mark shown in FIG. 2.

FIG. 3 is a cross-sectional view taken along line B-B of the reference mark 20 shown in FIG. 2 that indicates the cross-sectional structure of the reference marks 20.

As shown in FIG. 3, in the substrate with the multilayer reflective film 10 of the present embodiment, the reference marks 20 are formed into a concave shape on the surface of the protective film 18 when viewing a cross-section of the substrate with the multilayer reflective film 10 (cross-section perpendicular to the main surface of the substrate with the multilayer reflective film 10). A "concave shape" here refers to the reference marks 20 being formed downward from the protective film 18, such as by being indented in the shape of a step or curve, when viewing a cross-section of the substrate with the multilayer reflective film 10.

An element that is the same as at least one of the elements contained in the protective film 18 is contained in a surface layer 22 of the reference marks 20. At least one element selected from the group consisting of Ru, Nb, Zr, Y, B, Ti, La, Mo, Co, Re, Si, Rh and Cr, for example, is contained in the surface layer 22 of the reference marks 20. Ruthenium (Ru), which is an element that is the same as an element contained in the protective film 18, is preferably contained in the surface layer 22 of the reference marks 20. The type of element contained in the surface layer of the reference marks 20 can be specified by, for example, energy dispersive X-ray spectroscopy (EDX).

An oxide of an element that is the same as at least one of the elements contained in the protective film 18 may also be contained in the surface layer 22 of the reference marks 20. An oxide of at least one element or compound selected from the group consisting of Ru, Ru—(Nb, Zr, Y, B, Ti, La, Mo, Co or Re) compound, Si—(Ru, Rh, Cr or B) compound, Si, Zr, Nb, La and B, for example, may be contained in the surface layer 22 of the reference marks 20.

In the case Ru or RuNb is contained in the protective film 18, an oxide of Ru or RuNb may be contained in the surface layer 22 of the reference marks 20. For example, at least one of RuO and RuNbO may be contained in the surface layer 22 of the reference marks 20.

Furthermore, the "surface layer 22" of the reference marks 20 refers to a region extending to a depth of 2 nm from the surface of the reference marks 20.

An element that is the same as an element contained in the protective film 18 is contained in the surface layer 22. The element that is the same as an element contained in the protective film 18 may be contained throughout the surface layer 22 or contained in a portion of the surface layer 22. The element that is the same as an element contained in the protective film 18 is preferably contained throughout the surface layer 22. In this case, there is no exposure of the material contained in the multilayer reflective film 14, and deterioration of cleaning resistance of the substrate with the multilayer reflective film 10 can be prevented.

In the case Ru or a Ru compound is contained in the protective film 18, a surface layer 14*a* of the multilayer reflective film 14 on the opposite side from the substrate 12 is preferably a layer that contains Si (Si film). This is because cleaning resistance of the substrate with the multilayer reflective film 10 improves since RuSi is formed by a reaction between Ru and Si in the surface layer 22 of the reference marks 20 due to heat generated during laser processing of the reference marks 20.

In the case Ru or a Ru compound is contained in the protective film 18 and the surface layer 14*a* of the multilayer reflective film 14 contains Si, at least one of, for example, RuSi and RuSiO may be contained in the surface layer 22 of the reference marks 20.

As shown in FIG. 3, a shrink region 24, where at least a portion of a plurality of films contained in the multilayer reflective film 14 are shrunk, is formed at the bottom of the reference marks 20. The bottom of the reference marks 20 refers to a region below the concave-shaped surface layer 22 that extends to the upper surface of the substrate 12.

In the shrink region 24, the thickness of at least a portion of the plurality of films contained in the multilayer reflective film 14 is shrunk. For example, in the case the multilayer reflective film 14 is a Mo/Si laminated film obtained by cyclically laminating a Mo film having a thickness of 3 nm and a Si film having a thickness of 4 nm, the thickness of one cycle of Mo/Si film is 7 nm. In the shrink region 24, the thickness of one cycle of Mo/Si film is shrunk, for example, from 7 nm to 6 nm. In this case, since the thickness before shrinking is 7 nm and the thickness after shrinking is 6 nm, the shrinkage factor of the thickness of the multilayer reflective film 14 is about 86%. In the shrink region 24, the shrinkage factor of the thickness of the multilayer reflective film 14 is preferably 75% to 95% and more preferably 80% to 90%.

Although at least a portion of the plurality of films contained in the multilayer reflective film 14 are shrunk in the shrink region 24, the laminated structure of the multilayer reflective film 14 is maintained. Whether or not the laminated structure of the multilayer reflective film 14 is maintained can be confirmed by, for example, a TEM micrograph of a cross-section of the substrate with the multilayer reflective film 10.

As shown in FIG. 3, a mixing region 26, which is integrated with at least a portion of the plurality of films contained in the multilayer reflective film 14, is formed above the shrink region 24 in the vicinity of the center of the bottom of the reference marks 20. In the mixing region 26, a plurality of the films contained in the multilayer reflective film 14 are integrated by mutually reacting due to heat generated during laser processing of the reference marks 20. For example, in the case the multilayer reflective film 14 is a Mo/Si laminated film, Mo film and Si film react to generate MoSi in the mixing region 26.

Although the mixing region 26 is easily formed in the vicinity of the center of the bottom of the reference marks 20, it may also be formed in a portion other than the center. The thickness of the mixing region 26 is preferably not more than 200 nm and more preferably not more than 150 nm. In this case, the protective film 18 remains on the surface layer 22 of the reference marks 20 and elements of the protective film 18 are easily contained in the surface layer 22. The thickness of the mixing layer 26 refers to the maximum value of thickness in the vertical direction of the mixing region 26. In addition, although FIG. 3 shows an example of the formation of the mixing region 26, the mixing region 26 may not be formed depending on such factors as laser processing conditions.

In the mixing region 26, since a plurality of films contained in the multilayer reflective film 14 is integrated into a single unit, the laminated structure of the multilayer reflective film 14 is not maintained. Whether or not a plurality of films contained in the multilayer reflective film 14 is integrated into a single unit can be easily confirmed by a TEM micrograph of a cross-section of the substrate with the multilayer reflective film 10.

As shown in FIG. 3, depth D of the reference marks 20 formed to a concave shape is preferably 30 nm to 50 nm. Depth D refers to the distance in the vertical direction from the surface of the protective film 18 to the deepest location of the bottom of the reference marks 20.

As shown in FIG. 3, the angle of inclination θ of the reference marks 20 formed to a concave shape is preferably less than 25 degrees and more preferably 3 degrees to 10 degrees. The angle of inclination θ refers to the angle formed by an extended line 22*a* extending from the surface layer 22 of the reference marks 20 and a surface 18*a* of the protective film 18 when viewing a cross-section of the reference marks 20.

There are no particular limitations on the method used to form the reference marks 20. The reference marks 20 can be formed by, for example, laser processing the surface of the protective film 18. An example of laser processing conditions is indicated below.

Type of laser (wavelength): Ultraviolet-visible light region, e.g. semiconductor laser having a wavelength of 405 nm Laser output: 1 mW to 120 mW Scanning speed: 0.1 mm/s to 20 mm/s Pulse frequency: 1 MHz to 100 MHz Pulse width: 3 ns to 1000 s The laser used during laser processing of the reference marks 20 may be a continuous wave or pulsed wave. In the case of using a pulsed wave, the width W of the reference marks 20 can be made smaller even for about the same depth D of the reference marks 20 in comparison with a continuous wave. In addition, in the case of using a pulsed wave, the angle of inclination θ of the reference marks 20 can be increased in comparison with a continuous wave. Consequently, in the case of using a pulsed wave, contrast can be increased and reference marks 20 that are more easily detected by defect inspection apparatuses or electron beam drawing apparatuses can be formed in comparison with a continuous wave.

The reference marks 20 can be used as, for example, fiducial marks (FM). FM refer to marks used as references for defect coordinates when drawing a pattern with an electron beam drawing apparatus. FM normally have the shape of a cross as shown in FIG. 2.

For example, in the case of having formed the reference marks 20 on the substrate with the multilayer reflective film 10, the coordinates of the reference marks 20 and the coordinates of a defect can be acquired with high precision by a defect inspection apparatus. Next, an absorber film is formed on the protective film 18 of the substrate with the multilayer reflective film 10. Next, a resist film is formed on the absorber film. A hard mask film (or etching mask film) may be formed between the absorber film and the resist film. The concave reference marks 20 formed on the protective film 18 of the substrate with the multilayer reflective film 10 are transferred to the absorber film and resist film or transferred to the absorber film, hard mask film and resist film.

When a pattern is then drawn in the resist film with an electron beam drawing apparatus, the reference marks 20 transferred to the resist film are used as FM which are references for the location of a defect.

Thus, the reference marks 20 formed on the substrate with the multilayer reflective film 10 are required to have high contrast to a degree that enables detection by a defect inspection apparatus. Examples of defect inspection apparatuses include the MAGIC SM7360 Mask Substrate/Blank Defect Inspection Apparatus for EUV Exposure manufactured by Lasertec Corp. and having an inspection light source wavelength of 266 nm, a member of the Teron 600 Series (such as the Teron 610) of EUVMask/Blank Defect Inspection Apparatuses manufactured by KLA-Tencor Corp. and having an inspection light source wavelength of 193 nm, and the Actinic Blank Inspection (ABI) System in which the inspection light source wavelength is the same as the exposure light source wavelength of 13.5 nm. In addition, the reference marks 20 transferred to the absorber film and the resist film thereon are required to have high contrast to a degree that enables detection by an electron beam drawing apparatus. Moreover, the reference marks 20 preferably have high contrast to a degree that enables detection with a coordinate measuring instrument. A coordinate measuring instrument is able to convert the coordinates of a defect acquired by a defect inspection apparatus to reference coordinates of an electron beam drawing apparatus. A user who has been provided with the substrate with the multilayer reflective film 10 is able to compare the location of a defect specified by a defect inspection apparatus with drawing data both easily and with high precision based on the reference marks 20.

The use of the reference marks 20 as FM enables defect coordinates to be managed with high precision. For example, defect coordinates can be converted to the coordinate system of an electron beam drawing apparatus by detecting the FM with the electron beam drawing apparatus. Pattern drawing data drawn by the electron beam drawing apparatus can then be corrected so that, for example, a defect is arranged beneath an absorber film pattern. As a result, the effect of the defect on the ultimately fabricated reflective mask can be reduced (and this process is referred to as defect mitigation).

The reference marks 20 can also be used as alignment marks (AM). AM are marks that can be used as reference marks for defect coordinates when inspecting defects on the multilayer reflective film 14 with a defect inspection apparatus. However, AM are not used directly when drawing a pattern with an electron beam drawing apparatus. AM can have the shape of a circle, rectangle or cross.

In the case of having formed AM on the multilayer reflective film 14, a portion of the absorber film on the AM is preferably removed together with forming FM on the absorber film on the multilayer reflective film 14. AM can be detected with a defect inspection apparatus and coordinate measuring instrument. FM can be detected with a coordinate measuring instrument and electron beam drawing apparatus. Relative management of coordinates between AM and FM makes it possible to manage defect coordinates with high precision.

[Reflective Mask Blank]

Figure 4:
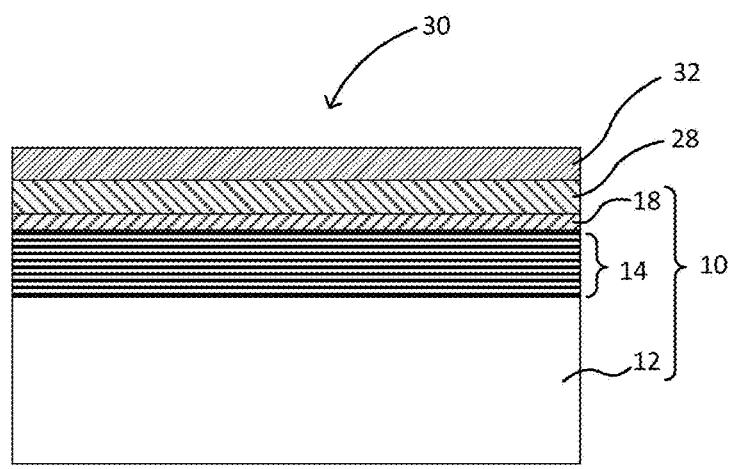
FIG. 4 is a schematic diagram showing a cross-section of a reflective mask blank.

FIG. 4 is a schematic diagram showing a cross-section of a reflective mask blank 30 of the present embodiment. The reflective mask blank 30 of the present embodiment can be fabricated by forming an absorber film 28 that absorbs EUV light on the protective film 18 of the previously described substrate with the multilayer reflective film 10.

The absorber film 28 has the function of absorbing EUV light serving as exposure light. Namely, the difference between reflectance of the multilayer reflective film 14 with respect to EUV light and reflectance of the absorber film 28 with respect to EUV light is not less than a prescribed value. For example, reflectance of the absorber film 28 with respect to EUV light is 0.1% to 40%. The difference between light reflected by the multilayer reflective film 14 and light reflected by the absorber film 28 may be a prescribed phase difference. Furthermore, in this case, the absorber film 28 in the reflective mask blank 30 is referred to as a phase shift film.

The absorber film 28 has the function of absorbing EUV light and preferably can be removed by etching. The absorber film 28 can preferably be etched by dry etching with a chlorine (Cl)-based gas or fluorine (F)-based gas. There are no particular limitations on the material of the absorber film 28 provided the absorber film 28 retains such a function.

The absorber film 28 may have a single-layer structure or laminated structure. In the case the absorber film 28 has a laminated structure, a plurality of films comprised of the same material may be laminated or a plurality of films comprised of different materials may be laminated. In the case the absorber film 28 has a laminated structure, the material and composition may change incrementally and/or continuously in the direction of film thickness.

The material of the absorber film 28 is preferably tantalum (Ta) alone or a material that contains Ta. Examples of materials containing Ta include materials containing Ta and B, materials containing Ta and N, materials containing Ta, B, and at least one of O and N, materials containing Ta and Si, materials containing Ta, Si and N, materials containing Ta and Ge, materials containing Ta, Ge and N, materials containing Ta and Pd, materials containing Ta and Ru, and materials containing Ta and Ti.

The absorber film 28 may also contain at least one material selected from the group consisting of, for example, Ni alone, material containing Ni, Cr alone, material containing Cr, Ru alone, material containing Ru, Pd alone, material containing Pd, Mo alone and material containing Mo.

The thickness of the absorber film 28 is preferably 30 nm to 100 nm.

The absorber film 28 can be formed by a known method such as magnetron sputtering or ion beam sputtering.

A resist film 32 may be formed on the absorber film 28 in the reflective mask blank 30 of the present embodiment. An aspect thereof is shown in FIG. 4. After having drawn and exposed a pattern on the resist film 32 with an electron beam drawing apparatus, a resist pattern can be formed by going through a development process. A pattern can be formed on the absorber film 28 by carrying out dry etching on the absorber film 28 while using this resist pattern as a mask.

The resist film 32 over the reference marks 20 may be locally removed so as to facilitate detection of the concave reference marks 20 formed on the protective film 18 with an electron beam drawing apparatus. There are no particular limitations on the manner of removal. In addition, for example, the resist film 32 and the absorber film 28 over the reference marks 20 may also be removed.

A hard mask film may be formed between the absorber film 28 and the resist film 32 in the reflective mask blank 30 of the present embodiment. The hard mask film is used as a mask when patterning the absorber film 28. The hard mask film and the absorber film 28 are formed with materials having mutually different etching selectivity. In the case the material of the absorber film 28 contains tantalum or a tantalum compound, the material of the hard mask film preferably contains chromium or a chromium compound. The chromium compound preferably contains Cr and at least one component selected from the group consisting of N, O, C and H.

[Reflective Mask] A reflective mask 40 of the present embodiment can be fabricated using the reflective mask blank 30 of the present embodiment. The following provides an explanation of a method of fabricating the reflective mask 40.

FIGS. 5A-5E are schematic diagrams showing a method of fabricating the reflective mask 40.

Figure 5A:
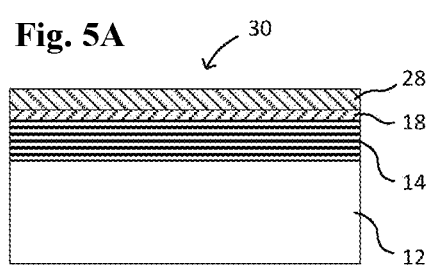
FIGS. 5A-5E are schematic diagrams showing a method of fabricating a reflective mask.
Figure 5D:
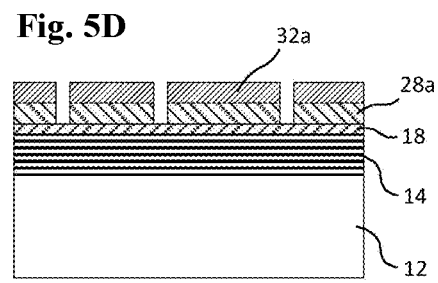
Figure 5B:
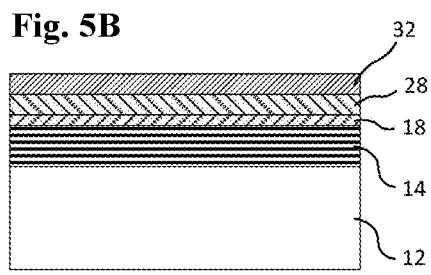
Figure 5E:
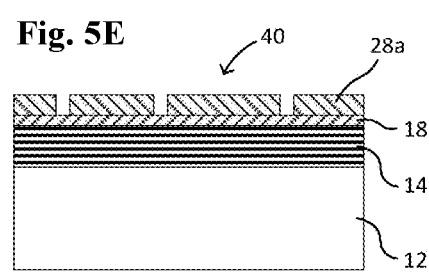
Figure 5C:
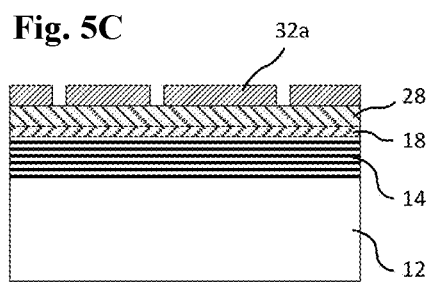

As shown in FIGS. 5A-5E, the reflective mask blank 30 having the substrate 12, the multilayer reflective film 14 formed on the substrate 12, the protective film 18 formed on the multilayer reflective film 14, and the absorber film 28 formed on the protective film 18 is first prepared (FIG. 5A). Next, the resist film 32 is formed on the absorber film 28 (FIG. 5B). A pattern is drawn on the resist film 32 with an electron beam drawing apparatus, and a resist pattern 32a is further formed by going through a development/rinsing process (FIG. 5C).

The absorber film 28 is dry-etched by using the resist pattern 32a as a mask. As a result, the portion of the absorber film 28 not covered by the resist pattern 32a is etched and an absorber film pattern 28a is formed (FIG. 5D).

Furthermore, for example, a chlorine-based gas such as $Cl_2$, $SiCl_4$, $CHCl_3$ or $CCl_4$, a mixed gas containing these chlorine-based gas and $O_2$ at a prescribed ratio, a mixed gas containing a chlorine-based gas and He at a prescribed ratio, a mixed gas containing a chlorine-based gas and Ar at a prescribed ratio, a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$ or F, a mixed gas containing these fluorine-based gas and $O_2$ at a prescribed ratio, a mixed gas containing a fluorine-based gas and He at a prescribed ratio, or a mixed gas containing a fluorine-based gas and Ar at a prescribed ratio can be used for the etching gas.

After having formed the absorber film pattern 28a, the resist pattern 32a is removed with, for example a resist stripping solution. After having removed the resist pattern 32a, the reflective mask 40 of the present embodiment is obtained by going through a wet cleaning process using an acidic or alkaline aqueous solution (FIG. 5E).

[Method of Manufacturing Semiconductor Device]

A transfer pattern can be formed on a semiconductor substrate by lithography using the reflective mask 40 of the present embodiment. This transfer pattern has a shape that is transferred by the absorber film pattern 28a of the reflective mask 40. A semiconductor device can be manufactured by forming the transfer pattern on the semiconductor substrate with the reflective mask 40.

Figure 6:
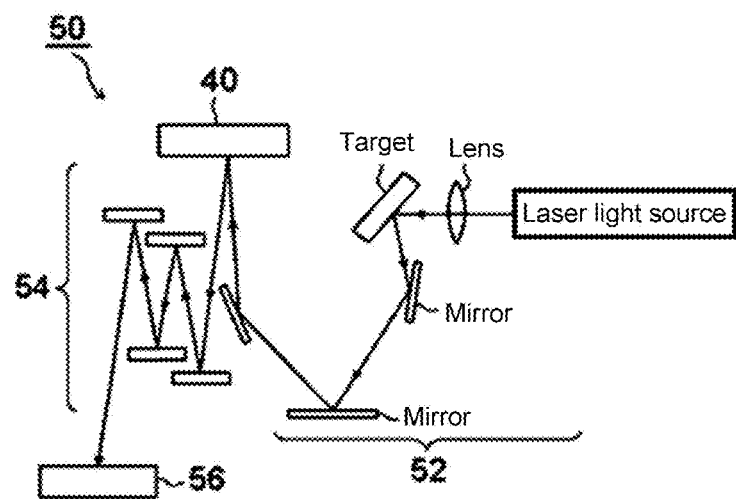
FIG. 6 shows a pattern transfer apparatus.

The following provides an explanation of the method used to transfer a pattern to a semiconductor substrate with resist 56 by EUV light with reference to FIG. 6.

FIG. 6 shows a pattern transfer apparatus 50. The pattern transfer apparatus 50 is provided with a laser plasma X-ray source 52, the reflective mask 40 and an optical reduction system 54. X-ray reflecting mirrors are used for the optical reduction system 54.

A pattern reflected by the reflective mask 40 is normally reduced to about ¼ by the optical reduction system 54. For example, a wavelength band of 13 nm to 14 nm is used as the exposure wavelength and the light path is preset to be in a vacuum. EUV light generated with the laser plasma X-ray light source 52 is allowed to enter the reflective mask 40 under these conditions. Light that has been reflected by the reflective mask 40 is transferred onto the semiconductor substrate with resist 56 through the optical reduction system 54.

Light that has entered the reflective mask 40 is absorbed by the absorber film 28 and not reflected at those portions where the absorber film pattern 28a is present. On the other hand, light that has entered those portions where the absorber film pattern 28a is not present is reflected by the multilayer reflective film 14.

Light that has been reflected by the reflective mask 40 enters the optical reduction system 54. Light that has entered the optical reduction system 54 forms a transfer pattern on the resist layer of the semiconductor substrate with resist 56. A resist pattern can then be formed on the semiconductor substrate with resist 56 by developing the exposed resist layer. A prescribed wiring pattern, for example, can be formed on the semiconductor substrate by etching the semiconductor substrate 56 while using the resist pattern as a mask. A semiconductor device can be manufactured by going through this and other necessary steps.

According to the substrate with the multilayer reflective film 10 of the present embodiment, reference marks 20 are formed to a concave shape on the surface of the protective film 18. The surface layer of the reference marks 20 contains an element that is the same as at least one of the elements contained in the protective film 18. In addition, a shrink region 24, where at least a portion of a plurality of films contained in the multilayer reflective film 14 are shrunk, is formed at the bottom of the reference marks 20.

According to the substrate with the multilayer reflective film 10 of the present embodiment, the surface of the multilayer reflective film 14 can be prevented from being contaminated by dust generated during laser processing of the reference marks 20. This is because at least a portion of the protective film 18 remains on the surface layer 22 of the reference marks 20.

According to the substrate with the multilayer reflective film 10 of the present embodiment, the material of the multilayer reflective film 14 can be prevented from being exposed on the surface of the reference marks 20. Thus, the substrate with the multilayer reflective film 10, the reflective mask blank 30 and the reflective mask 40 can be fabricated that have superior cleaning resistance.

According to the substrate with the multilayer reflective film 10 of the present embodiment, the amount of time required for processing the reference marks can be shortened in comparison with the case of using FIB.

EXAMPLES

The following provides an explanation of more detailed examples of the present disclosure.

Example 1

A $SiO_2$—$TiO_2$-based glass substrate (square measuring 6 inches on a side, thickness: 6.35 mm) was prepared. The edges of this glass substrate were subjected to chamfering, grinding and coarse polishing treatment with a polishing solution containing cerium oxide abrasive particles. Following completion of this treatment, the glass substrate was placed in the carrier of a double-side polishing apparatus followed by carrying out precision polishing under prescribed polishing conditions using an aqueous alkaline solution containing colloidal silica abrasive particles in a polishing solution. Following completion of precision polishing, cleaning treatment was carried out on the glass substrate. Surface roughness of the main surface of the resulting glass substrate in terms of root mean square (RMS) roughness was not more than 0.10 nm. The degree of flatness of the main surface of the resulting glass substrate was not more than 30 nm in a measurement region of 132 mm×132 mm.

A back side conductive film comprised of CrN was formed on the back side of the aforementioned glass substrate by magnetron sputtering under the conditions indicated below.

(Conditions): Cr target, Ar+$N_2$ gas atmosphere (Ar: $N_2$=90%:10%), film composition (Cr: 90 atom %, N: 10 atom %), film thickness: 20 nm A multilayer reflective film was formed on the main surface of the glass substrate on the opposite side from the side where the back side conductive film was formed by cyclically laminating Mo film/Si film.

Specifically, a Mo film and Si film were alternately laminated on the substrate by ion beam sputtering (using Ar) using a Mo target and Si target. The thickness of the Mo film was 2.8 nm. The thickness of the Si film was 4.2 nm. The thickness of one cycle of Mo/Si film was 7.0 nm. A multilayer reflective film was formed by laminating 40 cycles of Mo/Si film in this manner followed by finally depositing a Si film at a film thickness of 4.0 nm.

A protective film containing a Ru compound was formed on the multilayer reflective film. Specifically, a protective film comprised of an RuNb film was formed on the multilayer reflective film by DC magnetron sputtering in an Ar gas atmosphere using a RuNb target (Ru: 80 atom %, Nb: 20 atom %). The thickness of the protective film was 2.5 nm.

Reference marks were formed on the protective film by laser processing.

The conditions used for laser processing were as indicated below.

Type of laser: Semiconductor laser having a wavelength of 405 nm

Laser output: 20 mW (continuous wave)

Spot size: 430 nmφ

The shape and dimensions of the reference marks were as indicated below.

Shape: Roughly cross-shaped

Depth D: 40 nm

Width W: 2 μm

Length: 1 mm

Angle of inclination θ: 5.7 degrees

Figure 7:
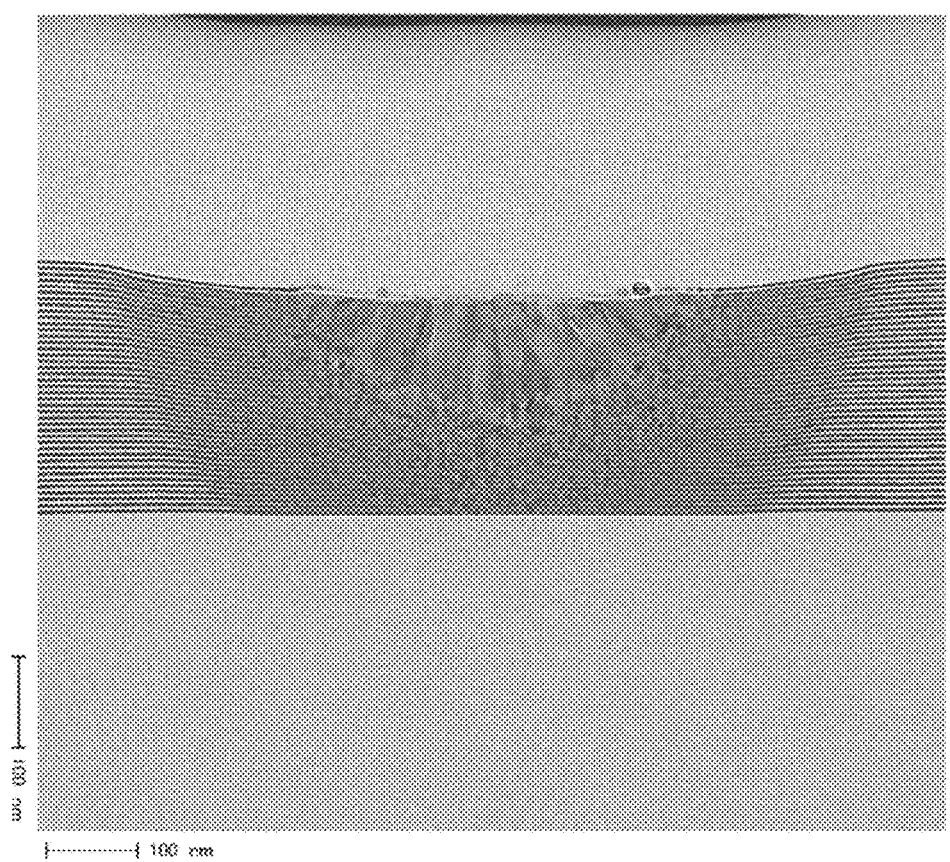
FIG. 7 is a TEM micrograph of a cross-section of a reference mark.

A cross-section of a reference mark was photographed with a transmission electron microscope (TEM). The resulting image is shown in FIG. 7. As can be understood from FIG. 7, a shrink region, where at least a portion of the plurality of films contained in the multilayer reflective film were shrunk, was formed at the bottom of the concave reference mark. In addition, a mixing region, where at least a portion of the plurality of films contained in the multilayer reflective film are mutually integrated, was formed above the shrink region and in the vicinity of the center of the bottom of the reference mark. In the shrink region, the thickness of one cycle of Mo/Si film contained in the multilayer reflective film was reduced from 7.0 nm to 6.0 nm. The thickness of the mixing region was 120 nm.

The surface layer of the reference mark was analyzed by energy dispersive X-ray spectroscopy (EDX). As a result, Ru and Nb, which are the same elements as elements contained in the protective layer, were contained in the surface layer of the shrink region of the reference mark. In addition, since oxygen (O) was also detected, the surface layer of the reference mark is thought to contain RuNbO. In addition, since Ru, Nb, Si, Mo and O were contained in the surface layer of the mixing region of the reference mark, RuNbO, RuSi or MoSi are thought to be contained.

A defect inspection was carried out on the substrate with the multilayer reflective film using a defect inspection apparatus (ABI, Lasertec Corp.). In this defect inspection, the locations of defects were specified using reference marks formed to a concave shape on the surface of a protective film as references. As a result, the number of defects was reduced in comparison with the case of having formed reference marks according to the conventional FIB method.

A reflective mask blank was fabricated by forming an absorber film on the protective film of the substrate with the multilayer reflective film. Specifically, an absorber film comprised of a laminated film of TaBN (thickness: 56 nm) and TaBO (thickness: 14 nm) was formed by DC magnetron sputtering. The TaBN film was formed by reactive sputtering in a mixed gas atmosphere of Ar gas and $N_2$ gas using a TaB target. The TaBO film was formed by reactive sputtering in a mixed gas atmosphere of Ar gas and $O_2$ gas using a TaB target.

The concave reference marks transferred to the absorber film were detected with an electron beam drawing apparatus. As a result, the reference marks were able to be detected and the reference marks transferred to the absorber film were able to be confirmed to have sufficient contrast to a degree that enables detection by an electron beam drawing apparatus.

A defect inspection was carried out on the absorber film using a defect inspection apparatus (M8350, Lasertec Corp.). In this defect inspection, the locations of defects were specified by using reference marks transferred to a concave shape on the absorber film as references. As a result, the number of defects was reduced in comparison with the case of having formed reference marks according to the conventional FIB method.

A resist film was formed on the absorber film of the reflective mask blank fabricated in the manner described above. A pattern was drawn in the resist film with an electron beam drawing apparatus using defect information obtained from the defect inspection. After drawing the pattern, prescribed development treatment was carried out and a resist pattern was formed on the absorber film.

A pattern was formed on the absorber film by using the resist pattern as a mask. Specifically, after having dry-etched the upper layer TaBO film with a fluorine-based gas ($CF_4$ gas), the lower layer TaBN film was dry-etched with a chlorine-based gas ($Cl_2$ gas).

The resist pattern remaining on the absorber film pattern was removed with hot sulfuric acid to obtain the reflective mask according to Example 1. In the case of placing the resulting reflective mask in an exposure apparatus and transferring the pattern to a semiconductor substrate having a resist film formed thereon, there were no defects in the transferred pattern attributable to the reflective mask and favorable pattern transfer was able to be carried out.

Example 2

A $SiO_2$—$TiO_2$-based glass substrate (square measuring 6 inches on a side, thickness: 6.35 mm) was prepared. The edges of this glass substrate were subjected to chamfering, grinding and coarse polishing treatment with a polishing solution containing cerium oxide abrasive particles. Following completion of this treatment, the glass substrate was placed in the carrier of a double-side polishing apparatus followed by carrying out precision polishing under prescribed polishing conditions using an aqueous alkaline solution containing colloidal silica abrasive particles in a polishing solution. Following completion of precision polishing, cleaning treatment was carried out on the glass substrate. Surface roughness of the main surface of the resulting glass substrate in terms of root mean square (RMS) roughness was not more than 0.10 nm. The degree of flatness of the main surface of the resulting glass substrate was not more than 30 nm in a measurement region of 132 mm×132 mm.

A back side conductive film comprised of CrN was formed on the back side of the aforementioned glass substrate by magnetron sputtering under the conditions indicated below.

(Conditions): Cr target, Ar+$N_2$ gas atmosphere (Ar: $N_2$=90%:10%), film composition (Cr: 90 atom %, N: 10 atom %), film thickness: 20 nm A multilayer reflective film was formed on the main surface of the glass substrate on the opposite side from the side where the back side conductive film was formed by cyclically laminating Mo film/Si film.

Specifically, a Mo film and Si film were alternately laminated on the substrate by ion beam sputtering (using Ar) using a Mo target and Si target. The thickness of the Mo film was 2.8 nm. The thickness of the Si film was 4.2 nm. The thickness of one cycle of Mo/Si film was 7.0 nm. A multilayer reflective film was formed by laminating 40 cycles of Mo/Si film in this manner followed by finally depositing a Si film at a film thickness of 4.0 nm.

A protective film containing Ru was formed on the multilayer reflective film. Specifically, a protective film comprised of a Ru film was formed on the multilayer reflective film by DC magnetron sputtering in an Ar gas atmosphere using a Ru target. The thickness of the protective film was 2.5 nm.

Reference marks were formed on the protective film by laser processing.

The conditions used for laser processing were as indicated below.

Type of laser: Semiconductor laser having a wavelength of 405 nm
Laser output: 20 mW (continuous wave)
Spot size: 430 nmφ
The shape and dimensions of the reference marks were as indicated below.
Shape: Roughly cross-shaped
Depth D: 40 nm
Width W: 2 μm
Length L: 1 mm
Angle of inclination θ: 5.7 degrees A cross-section of a reference mark was photographed with a transmission electron microscope (TEM). As a result, a shrink region, where at least a portion of the plurality of films contained in the multilayer reflective film were shrunk, was formed at the bottom of the concave reference mark. In addition, a mixing region, where at least a portion of the plurality of films contained in the multilayer reflective film are mutually integrated, was formed above the shrink region and in the vicinity of the center of the bottom of the reference mark. In the shrink region, the thickness of one cycle of Mo/Si film contained in the multilayer reflective film was reduced from 7.0 nm to 6.0 nm. The thickness of the mixing region was 120 nm.

The surface layer of the reference mark was analyzed by energy dispersive X-ray spectroscopy (EDX). As a result, Ru, which is the same element as the elements contained in the protective layer, was contained in the surface layer of the shrink region of the reference mark. In addition, since oxygen (O) was also detected, the surface layer of the reference mark is thought to contain RuO. In addition, since Ru, Si, Mo and O were contained in the surface layer of the mixing region of the reference mark, RuO, RuSi or MoSi are thought to be contained.

A defect inspection was carried out on the substrate with the multilayer reflective film using a defect inspection apparatus (ABI, Lasertec Corp.). In this defect inspection, the locations of defects were specified using reference marks formed to a concave shape on the surface of a protective film as references. As a result, the number of defects was reduced in comparison with the case of having formed reference marks according to the conventional FIB method.

A reflective mask blank was fabricated by forming an absorber film on the protective film of the substrate with the multilayer reflective film. Specifically, an absorber film comprised of a laminated film of TaBN (thickness: 56 nm) and TaBO (thickness: 14 nm) was formed by DC magnetron sputtering. The TaBN film was formed by reactive sputtering in a mixed gas atmosphere of Ar gas and $N_2$ gas using a TaB target. The TaBO film was formed by reactive sputtering in a mixed gas atmosphere of Ar gas and $O_2$ gas using a TaB target.

The concave reference marks transferred to the absorber film were detected with an electron beam drawing apparatus. As a result, the reference marks were able to be detected and the reference marks transferred to the absorber film were able to be confirmed to have sufficient contrast to a degree that enables detection by an electron beam drawing apparatus.

A defect inspection was carried out on the absorber film using a defect inspection apparatus (M8350, Lasertec Corp.). In this defect inspection, the locations of defects were specified by using reference marks transferred to a concave shape on the absorber film as references. As a result, the number of defects was reduced in comparison with the case of having formed reference marks according to the conventional FIB method.

A resist film was formed on the absorber film of the reflective mask blank fabricated in the manner described above. A pattern was drawn in the resist film with an electron beam drawing apparatus using defect information obtained from the defect inspection. After drawing the pattern, prescribed development treatment was carried out and a resist pattern was formed on the absorber film.

A pattern was formed on the absorber film by using the resist pattern as a mask. Specifically, after having dry-etched the upper layer TaBO film with a fluorine-based gas ($CF_4$ gas), the lower layer TaBN film was dry-etched with a chlorine-based gas ($Cl_2$ gas).

The resist pattern remaining on the absorber film pattern was removed with hot sulfuric acid to obtain the reflective mask according to Example 2. In the case of placing the resulting reflective mask in an exposure apparatus and transferring the pattern to a semiconductor substrate having a resist film formed thereon, there were no defects in the transferred pattern attributable to the reflective mask and favorable pattern transfer was able to be carried out.

Example 3

A $SiO_2$—$TiO_2$-based glass substrate (square measuring 6 inches on a side, thickness: 6.35 mm) was prepared. The edges of this glass substrate were subjected to chamfering, grinding and coarse polishing treatment with a polishing solution containing cerium oxide abrasive particles. Following completion of this treatment, the glass substrate was placed in the carrier of a double-side polishing apparatus followed by carrying out precision polishing under prescribed polishing conditions using an aqueous alkaline solution containing colloidal silica abrasive particles in a polishing solution. Following completion of precision polishing, cleaning treatment was carried out on the glass substrate. Surface roughness of the main surface of the resulting glass substrate in terms of root mean square (RMS) roughness was not more than 0.10 nm. The degree of flatness of the main surface of the resulting glass substrate was not more than 30 nm in a measurement region of 132 mm×132 mm.

A back side conductive film comprised of CrN was formed on the back side of the aforementioned glass substrate by magnetron sputtering under the conditions indicated below.

(Conditions): Cr target, Ar+$N_2$ gas atmosphere (Ar: $N_2$=90%:10%), film composition (Cr: 90 atom %, N: 10 atom %), film thickness: 20 nm A multilayer reflective film was formed on the main surface of the glass substrate on the opposite side from the side where the back side conductive film was formed by cyclically laminating Mo film/Si film.

Specifically, a Mo film and Si film were alternately laminated on the substrate by ion beam sputtering (using Ar) using a Mo target and Si target. The thickness of the Mo film was 2.8 nm. The thickness of the Si film was 4.2 nm. The thickness of one cycle of Mo/Si film was 7.0 nm. A multilayer reflective film was formed by laminating 40 cycles of Mo/Si film in this manner followed by finally depositing a Si film at a film thickness of 4.0 nm.

A protective film containing a Ru compound was formed on the multilayer reflective film. Specifically, a protective film comprised of a RuNb film was formed on the multilayer reflective film by DC magnetron sputtering in an Ar gas atmosphere using a RuNb target (Ru: 80 atom %, Nb: 20 atom %). The thickness of the protective film was 2.5 nm.

Reference marks were formed on the protective film by laser processing.

The conditions used for laser processing were as indicated below.

Type of laser: Semiconductor laser having a wavelength of 405 nm
Laser output: 10 mW (continuous wave)
Spot size: 430 nmφ

The shape and dimensions of the reference marks were as indicated below.

Shape: Roughly cross-shaped
Depth D: 38 nm
Width W: 2 μm
Length L: 1 mm
Angle of inclination θ: 3.6 degrees The surface layer of a reference mark was analyzed by energy dispersive X-ray spectroscopy (EDX). As a result, Ru and Nb, which are the same elements as elements contained in the protective film, were contained in the surface layer of the reference mark.

A cross-section of a reference mark was photographed with a transmission electron microscope (TEM). As a result, a shrink region, where at least a portion of the plurality of films contained in the multilayer reflective film were shrunk, was formed at the bottom of the concave reference mark. However, differing from Example 1 and Example 2, a mixing region was not formed above the shrink region. In the shrink region, the thickness of one cycle of Mo/Si film contained in the multilayer reflective film was reduced from 7.0 nm to 6.2 nm.

A defect inspection was carried out on the substrate with the multilayer reflective film using a defect inspection apparatus (ABI, Lasertec Corp.). In this defect inspection, the locations of defects were specified using reference marks formed to a concave shape on the surface of a protective film as references. As a result, the number of defects was reduced in comparison with the case of having formed reference marks according to the conventional FIB method.

A reflective mask blank was fabricated by forming an absorber film on the protective film of the substrate with the multilayer reflective film. Specifically, an absorber film comprised of a laminated film of TaBN (thickness: 56 nm) and TaBO (thickness: 14 nm) was formed by DC magnetron sputtering. The TaBN film was formed by reactive sputtering in a mixed gas atmosphere of Ar gas and $N_2$ gas using a TaB target. The TaBO film was formed by reactive sputtering in a mixed gas atmosphere of Ar gas and $O_2$ gas using a TaB target.

The concave reference marks transferred to the absorber film were detected with an electron beam drawing apparatus. As a result, the reference marks were able to be detected and the reference marks transferred to the absorber film were able to be confirmed to have sufficient contrast to a degree that enables detection by an electron beam drawing apparatus.

A defect inspection was carried out on the absorber film using a defect inspection apparatus (M8350, Lasertec Corp.). In this defect inspection, the locations of defects were specified by using reference marks transferred to a concave shape on the absorber film as references. As a result, the number of defects was reduced in comparison with the case of having formed reference marks according to the conventional FIB method.

A resist film was formed on the absorber film of the reflective mask blank fabricated in the manner described above. A pattern was drawn in the resist film with an electron beam drawing apparatus based on defect information obtained from the defect inspection. After drawing the pattern, prescribed development treatment was carried out and a resist pattern was formed on the absorber film.

A pattern was formed on the absorber film by using the resist pattern as a mask. Specifically, after having dry-etched the upper layer TaBO film with a fluorine-based gas ($CF_4$ gas), the lower layer TaBN film was dry-etched with a chlorine-based gas ($Cl_2$ gas).

The resist pattern remaining on the absorber film pattern was removed with hot sulfuric acid to obtain the reflective mask according to Example 3. In the case of placing the resulting reflective mask in an exposure apparatus and transferring the pattern to a semiconductor substrate having a resist film formed thereon, there were no defects in the transferred pattern attributable to the reflective mask and favorable pattern transfer was able to be carried out.

Comparative Example 1

A $SiO_2$—$TiO_2$-based glass substrate (square measuring 6 inches on a side, thickness: 6.35 mm) was prepared. The edges of this glass substrate were subjected to chamfering, grinding and coarse polishing treatment with a polishing solution containing cerium oxide abrasive particles. Following completion of this treatment, the glass substrate was placed in the carrier of a double-side polishing apparatus followed by carrying out precision polishing under prescribed polishing conditions using an aqueous alkaline solution containing colloidal silica abrasive particles in a polishing solution. Following completion of precision polishing, cleaning treatment was carried out on the glass substrate. Surface roughness of the main surface of the resulting glass substrate in terms of root mean square (RMS) roughness was not more than 0.10 nm. The degree of flatness of the main surface of the resulting glass substrate was not more than 30 nm in a measurement region of 132 mm×132 mm.

A back side conductive film comprised of CrN was formed on the back side of the aforementioned glass substrate by magnetron sputtering under the conditions indicated below.

(Conditions): Cr target, Ar+$N_2$ gas atmosphere (Ar: $N_2$=90%:10%), film composition (Cr: 90 atom %, N: 10 atom %), film thickness: 20 nm A multilayer reflective film was formed on the main surface of the glass substrate on the opposite side from the side where the back side conductive film was formed by cyclically laminating Mo film/Si film.

Specifically, a Mo film and Si film were alternately laminated on the substrate by ion beam sputtering (using Ar) using a Mo target and Si target. The thickness of the Mo film was 2.8 nm. The thickness of the Si film was 4.2 nm. The thickness of one cycle of Mo/Si film was 7.0 nm. A multilayer reflective film was formed by laminating 40 cycles of Mo/Si film in this manner followed by finally depositing a Si film at a film thickness of 4.0 nm.

A protective film containing a Ru compound was formed on the multilayer reflective film. Specifically, a protective film comprised of a RuNb film was formed on the multilayer reflective film by DC magnetron sputtering in an Ar gas atmosphere using a RuNb target (Ru: 80 atom %, Nb: 20 atom %). The thickness of the protective film was 2.5 nm.

Reference marks were formed on the protective film by FIB.

The conditions used for FIB were as indicated below.
Acceleration voltage: 50 kV
Beam current value: 20 pA
The shape and dimensions of the reference marks were as indicated below.
Shape: Roughly cross-shaped
Depth D: 40 nm
Width W: 2 μm
Length L: 1 mm
Angle of inclination θ: 86 degrees The surface layer of a reference mark was analyzed by energy dispersive X-ray spectroscopy (EDX). As a result, Ru and Nb, which are the same elements as elements contained in the protective film, were not contained in the surface layer of the reference mark, while Mo and Si were detected. Since a protective layer does not remain on the surface layer of the reference marks, the material of the multilayer reflective film is thought to have been exposed.

A defect inspection was carried out on the substrate with the multilayer reflective film using a defect inspection apparatus (ABI, Lasertec Corp.). In this defect inspection, the locations of defects were specified using reference marks formed to a concave shape on the surface of a protective film as references. As a result, the number of defects increased considerably in comparison with Examples 1 to 3. This is presumed to have been caused by contamination of the surface of the multilayer reflective film by dust generated when the reference marks were processed by FIB. In addition, the amount of time required to process the reference marks increased considerably in comparison with Examples 1 to 3.

A reflective mask blank was fabricated by forming an absorber film on the protective film of the substrate with the multilayer reflective film. Specifically, an absorber film comprised of a laminated film of TaBN (thickness: 56 nm) and TaBO (thickness: 14 nm) was formed by DC magnetron sputtering. The TaBN film was formed by reactive sputtering in a mixed gas atmosphere of Ar gas and $N_2$ gas using a TaB target. The TaBO film was formed by reactive sputtering in a mixed gas atmosphere of Ar gas and $O_2$ gas using a TaB target.

A defect inspection was carried out on the absorber film using a defect inspection apparatus (M8350, Lasertec Corp.). In this defect inspection, the locations of defects were specified by using reference marks transferred to a concave shape on the absorber film as references. As a result, the number of defects increased considerably in comparison with Examples 1 to 3.

A resist film was formed on the absorber film of the reflective mask blank fabricated in the manner described above. A pattern was drawn in the resist film with an electron beam drawing apparatus based on defect information obtained from the defect inspection. After drawing the pattern, prescribed development treatment was carried out and a resist pattern was formed on the absorber film.

A pattern was formed on the absorber film by using the resist pattern as a mask. Specifically, after having dry-etched the upper layer TaBO film with a fluorine-based gas ($CF_4$ gas), the lower layer TaBN film was dry-etched with a chlorine-based gas ($Cl_2$ gas).

The resist pattern remaining on the absorber film pattern was removed with hot sulfuric acid to obtain the reflective mask according to Comparative Example 1. In the case of placing the resulting reflective mask in an exposure apparatus and transferring the pattern to a semiconductor substrate having a resist film formed thereon, it was difficult to carry out favorable pattern transfer since the number of defects in the transferred pattern attributable to the reflective mask was large in comparison with Examples 1 to 3.

BRIEF DESCRIPTION OF REFERENCE SYMBOLS

10 Substrate with a multilayer reflective film
12 Substrate
14 Multilayer reflective film
18 Protective film
20 Reference mark
24 Shrink region
26 Mixing region
28 Absorber film
30 Reflective mask blank
32 Resist film
40 Reflective mask
50 Pattern transfer apparatus

The invention claimed is:
1. A reflective structure, the reflective structure comprising:
a substrate;
a multilayer reflective film formed on the substrate;
a protective film formed on the multilayer reflective film; and
a plurality of reference marks that extend into the multilayer reflective film, wherein the multilayer reflective film has a plurality of layers and is configured to reflect EUV light, and wherein each reference mark of the plurality of reference marks includes:

a concave-shaped surface layer which contains an element that is the same as at least one element contained in the protective film, and a shrink region, at a bottom of the reference mark, within which at least some layers of the plurality of layers of the multilayer reflective film are shrunk.

2. The reflective structure according to claim 1, wherein, for each reference mark of the plurality of reference marks, the surface layer of the reference mark contains Ru.

3. The reflective structure according to claim 2, wherein, for each reference mark of the plurality of reference marks, the surface layer of the reference mark contains at least one selected from the group consisting of RuO, RuNbO, RuSi and RuSiO.

4. The reflective structure according to claim 1, each reference mark of the plurality of reference marks having a mixing region, above the shrink region, within which at least some layers of the plurality of layers of the multilayer reflective film are mutually integrated.

5. The reflective structure according to claim 1, wherein, for each reference mark of the plurality of reference marks, the depth of the reference mark is 30 nm to 50 nm.

6. The reflective structure according to claim 1, wherein a layer of the multilayer reflective film that is farthest from the substrate contains Si.

7. A reflective mask blank comprising:

a substrate;

a multilayer reflective film formed on the substrate;

a protective film formed on the multilayer reflective film;

an absorber film formed on the protective film and configured to absorb EUV light; and a plurality of reference marks that extend into the multilayer reflective film;

wherein the multilayer reflective film has a plurality of layers and is configured to reflect EUV light, and wherein each reference mark of the plurality of reference marks includes:

a concave-shaped surface layer which contains an element that is the same as at least one element contained in the protective film, and a shrink region, at a bottom of the reference mark, within which at least some layers of the plurality of layers of the multilayer reflective film are shrunk, and wherein, for each reference mark of the plurality of reference marks, a concave shape of the reference mark is transferred to the absorber film.

8. The reflective mask blank according to claim 7, wherein, for each reference mark of the plurality of reference marks, the surface layer of the reference mark contains Ru.

9. The reflective mask blank according to claim 8, wherein, for each reference mark of the plurality of reference marks, the surface layer of the reference mark contains at least one selected from the group consisting of RuO, RuNbO, RuSi and RuSiO.

10. The reflective mask blank according to claim 7, each reference mark of the plurality of reference marks having a mixing region, above the shrink region, within which at least some layers of the plurality of layers of the multilayer reflective film are mutually integrated.

11. The reflective mask blank according to claim 7, wherein, for each reference mark of the plurality of reference marks, the depth of the reference mark is 30 nm to 50 nm.

12. The reflective mask blank according to claim 7, wherein a layer of the multilayer reflective film that is farthest from the substrate contains Si.

13. A reflective mask comprising:

a substrate;

a multilayer reflective film formed on the substrate;

a protective film formed on the multilayer reflective film;

an absorber film formed on the protective film and configured to absorb EUV light; and a plurality of reference marks that extend into the multilayer reflective film;

wherein the multilayer reflective film has a plurality of layers and is configured to reflect EUV light, and wherein each reference mark of the plurality of reference marks includes:

a concave-shaped surface layer which contains an element that is the same as at least one element contained in the protective film, and a shrink region, at a bottom of the reference mark, within which at least some layers of the plurality of layers of the multilayer reflective film are shrunk.

14. A method of manufacturing a semiconductor device, the method comprising using the reflective mask according to claim 13 to form a transfer pattern on a semiconductor substrate.

15. The reflective mask according to claim 13, wherein, for each reference mark of the plurality of reference marks, the surface layer of the reference mark contains Ru.

16. The reflective mask according to claim 15, wherein, for each reference mark of the plurality of reference marks, the surface layer of the reference mark contains at least one selected from the group consisting of RuO, RuNbO, RuSi and RuSiO.

17. The reflective mask according to claim 13, each reference mark of the plurality of reference marks having a mixing region, above the shrink region, within which at least some layers of the plurality of layers of the multilayer reflective film are mutually integrated.

18. The reflective mask according to claim 13, wherein, for each reference mark of the plurality of reference marks, the depth of the reference mark is 30 nm to 50 nm.

19. The reflective mask according to claim 13, wherein a layer of the multilayer reflective film that is farthest from the substrate contains Si.

* * * * *